US007006023B2

(12) United States Patent
Chen

(10) Patent No.: US 7,006,023 B2
(45) Date of Patent: Feb. 28, 2006

(54) SIGMA-DELTA MODULATOR WITH PASSIVE BANDPASS LOOP FILTER

(75) Inventor: Feng Chen, Plano, TX (US)

(73) Assignee: Texas Instruments Inc., Dallas, TX (US)

( * ) Notice: Subject to any disclaimer, the term of this patent is extended or adjusted under 35 U.S.C. 154(b) by 0 days.

(21) Appl. No.: 10/661,019

(22) Filed: Sep. 12, 2003

(65) Prior Publication Data

US 2005/0057382 A1 Mar. 17, 2005

(51) Int. Cl.
*H03M 3/00* (2006.01)

(52) U.S. Cl. ...................................... 341/143; 341/155

(58) Field of Classification Search ................ 341/143, 341/144, 155, 122

See application file for complete search history.

(56) References Cited

U.S. PATENT DOCUMENTS

| | | | | |
|---|---|---|---|---|
| 4,044,306 | A * | 8/1977 | Villeret et al. | 341/61 |
| 5,341,136 | A | 8/1994 | Przybysz et al. | 341/133 |
| 5,369,404 | A * | 11/1994 | Galton | 341/143 |
| 5,442,353 | A | 8/1995 | Jackson | 341/143 |
| 5,757,867 | A * | 5/1998 | Caulfield et al. | 375/350 |
| 5,940,447 | A * | 8/1999 | Connell et al. | 375/316 |
| 6,064,871 | A * | 5/2000 | Leung | 455/323 |
| 6,111,531 | A | 8/2000 | Farag | 341/143 |
| 6,121,910 | A * | 9/2000 | Khoury et al. | 341/143 |
| 6,157,329 | A | 12/2000 | Lee et al. | 341/133 |
| 6,172,631 | B1 | 1/2001 | Tsai et al. | 341/143 |
| 6,218,972 | B1 | 4/2001 | Groshong | 341/143 |
| 6,225,928 | B1 | 5/2001 | Green | 341/143 |
| 6,396,428 | B1 | 5/2002 | Cheng | 341/143 |
| 6,429,797 | B1 | 8/2002 | Wu | 341/143 |
| 6,459,743 | B1 * | 10/2002 | Lipka | 375/329 |
| 6,469,649 | B1 * | 10/2002 | Helkey et al. | 341/155 |
| 6,480,528 | B1 * | 11/2002 | Patel et al. | 375/148 |
| 6,518,905 | B1 | 2/2003 | Siferd | 341/143 |
| 6,556,158 | B1 * | 4/2003 | Steensgaard-Madsen | 341/131 |
| 6,707,409 | B1 * | 3/2004 | Ignjatovic et al. | 341/143 |
| 2003/0080888 | A1 * | 5/2003 | Muhammad et al. | 341/143 |

OTHER PUBLICATIONS

Chen et al. A 0.25-mW Low-Pas pasive Sigm-Delta Modulator with Buil-in Mixer for a 10-MHZ IF Input, IEEE Journal of Solid-State Circuits, VOl.32, No. 6. Jun. 1997.*

* cited by examiner

*Primary Examiner*—Peguy JeanPierre
(74) *Attorney, Agent, or Firm*—Wade James Brady, III; Frederick J. Telecky, Jr.

(57) ABSTRACT

Digitizing a signal includes sampling and holding an analog signal to yield a sampled signal, where the analog signal includes information. The sampled signal is filtered at a passive filter circuit to yield a filtered signal. The passive filter circuit includes at least one passive element and the filtered signal is characterized by a bandpass response. The filtered signal is quantized to yield a digital signal, where the digital signal corresponds to the analog signal and the digital signal includes the information.

20 Claims, 2 Drawing Sheets

FIG. 1
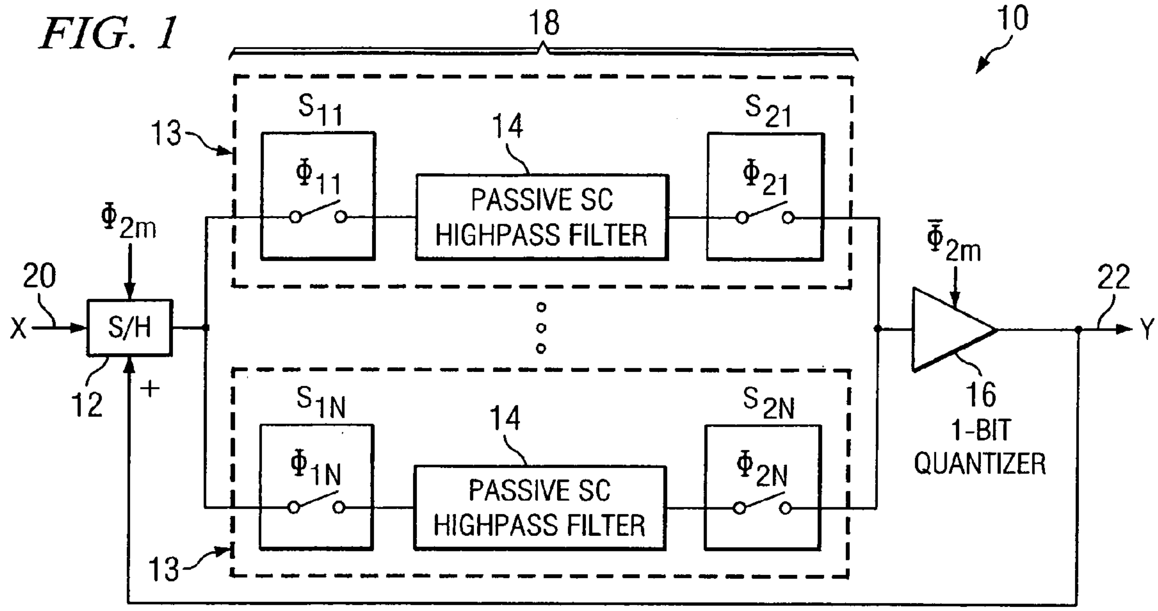
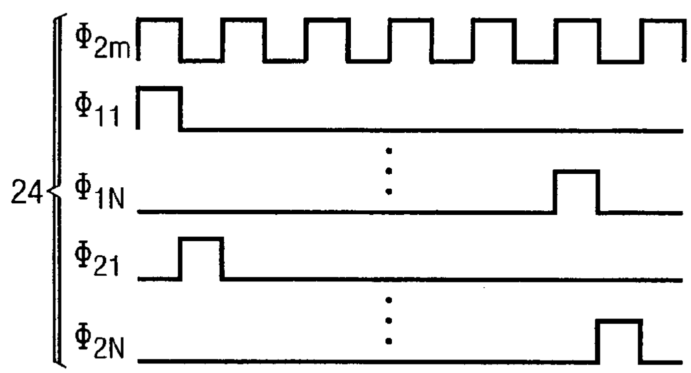
FIG. 2
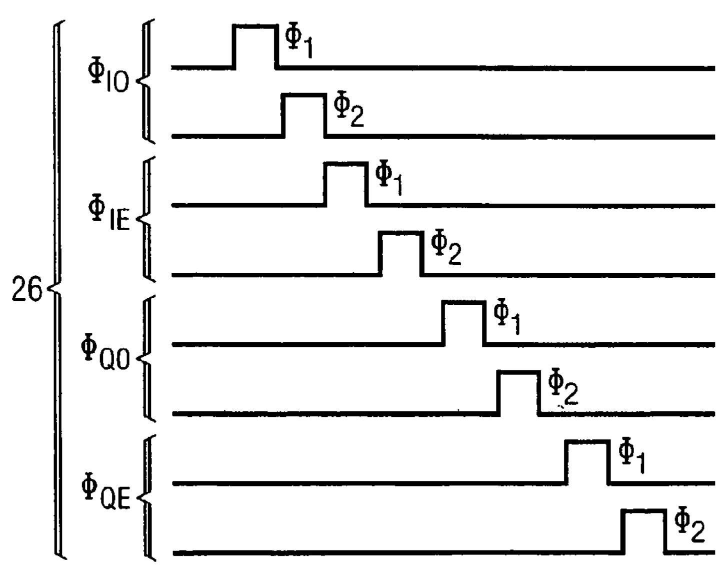
FIG. 4

SIGMA-DELTA MODULATOR WITH PASSIVE BANDPASS LOOP FILTER

TECHNICAL FIELD OF THE INVENTION

This invention relates generally to the field of signal processing and more specifically to a sigma-delta modulator with passive bandpass.

BACKGROUND OF THE INVENTION

Bandpass sigma-delta modulation typically involves using active filters to perform filtering functions in the feedback loop. Active filters, however, may include active components such as operational amplifiers and LC circuits that may consume a significant amount of power. Additionally, depending on the active components in the active filters may require the sigma-delta modulation to run at limited resolution. Consequently, known sigma-delta modulation may be unsatisfactory in certain situations.

SUMMARY OF THE INVENTION

In accordance with the present invention, disadvantages and problems associated with previous techniques of bandpass sigma-delta modulation may be reduced or eliminated.

According to one embodiment, digitizing a signal includes sampling and holding an analog signal to yield a sampled signal, where the analog signal includes information. The sampled signal is filtered at a passive filter circuit to yield a filtered signal. The passive filter circuit includes at least one passive element and the filtered signal is characterized by a bandpass response. The filtered signal is quantized to yield a digital signal, where the digital signal corresponds to the analog signal and the digital signal includes the information.

Certain embodiments of the invention may provide one or more technical advantages. A technical advantage of one embodiment may be that a bandpass sigma-delta modulator does not require the use of active components in the loop filter, which may allow the modulator to run at low power and low voltage. Another technical advantage of one embodiment may be that the bandpass sigma-delta modulator may be operate at a high sampling rate, which may allow the bandpass sigma-delta modulator to yield a higher resolution while maintaining low power consumption.

Certain embodiments of the invention may include none, some, or all of the above technical advantages. One or more other technical advantages may be readily apparent to one skilled in the art from the figures, descriptions, and claims included herein.

BRIEF DESCRIPTION OF THE DRAWINGS

For a more complete understanding of the present invention and its features and advantages, reference is now made to the following description, taken in conjunction with the accompanying drawings, in which:

FIG. 1 is a block diagram of an embodiment of a bandpass sigma-delta modulator that may be used in accordance with the present invention;

FIG. 2 is an example of a timing diagram that may be used with the bandpass sigma-delta modulator of FIG. 1;

FIG. 4 is an example of a timing diagram that may be used with the bandpass sigma-delta modulator of FIG. 3.

DETAILED DESCRIPTION OF THE DRAWINGS

Figure 3:
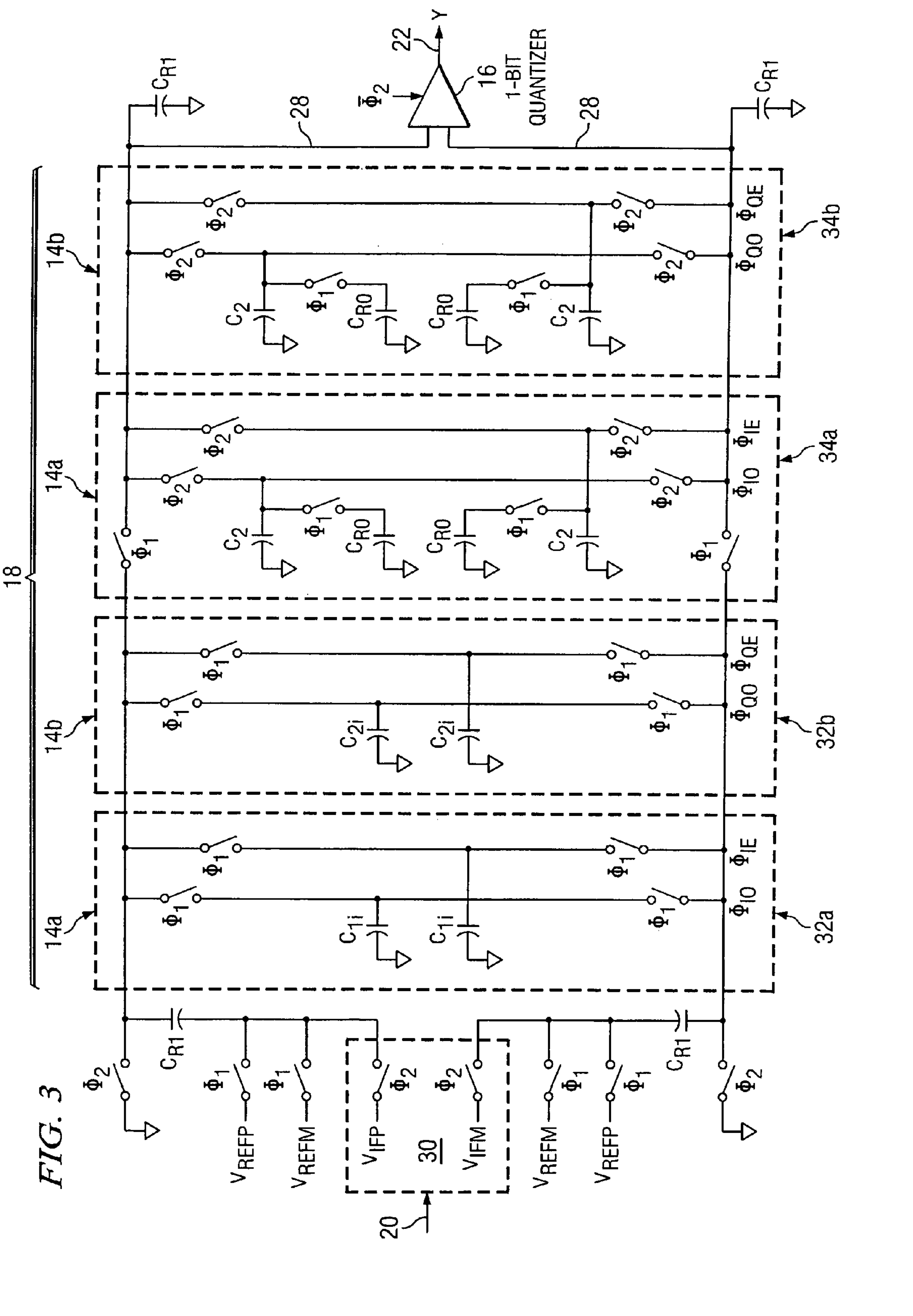
FIG. 3 is a circuit diagram of an embodiment of the bandpass sigma-delta modulator of FIG. 1 that may be used in accordance with the present invention.

Embodiments of the present invention and its advantages are best understood by referring to FIGS. 1 and 2 of the drawings, like numerals being used for like and corresponding parts of the various drawings.

FIG. 1 is a block diagram of an embodiment of a bandpass sigma-delta modulator 10. In general, bandpass sigma-delta modulator (SDM) 10 converts an analog signal 20 into a digital signal 22 by filtering a sampled analog signal using a passive bandpass loop filter 18. A quantizer 16 converts the filtered signal to digital signal 22. According to the illustrated embodiment, bandpass SDM 10 includes a sample-hold circuit 12, a passive bandpass loop filter 18, and a quantizer 16 coupled as shown in FIG. 1.

Sample-hold circuit 12 receives a control signal to sample and hold analog signal 20. According to one embodiment, sample-hold circuit 12 samples and holds analog signal 20 in response to a pulse of control signal $\phi_{2m}$. Sample-hold circuit 12 also receives a feedback signal comprising digital signal 22, and sums the analog signal 20 and digital signal 22. According to the illustrated embodiment, sample-hold circuit 12 comprises a high-speed sample-hold circuit that is shared among the multiple filter paths 13 of passive bandpass loop filter 18. Sample-hold circuit 12 may also convert mismatch errors between the signals of the filter paths into an overall gain or phase error. By sharing sample-hold circuit 12 between the filter paths, more efficient matching of gain and phase between the signals of the filter paths may be accomplished at a high speed sampling rate.

Passive bandpass loop filter 18 receives the sampled signal and one or more control signals to filter the sampled signal. For example, passive bandpass loop filter 18 filters the sampled signal to yield a filtered signal according to a bandpass response. According to one embodiment, passive bandpass loop filter 18 comprises N filter paths 13 placed in parallel to perform the bandpass response. According to the illustrated embodiment, a passive highpass filters 14 may be used at each filter path 13 in order to generate the filtered signal according to a bandpass response. Using highpass filters 14 instead of low pass filters may result in more efficient hardware. Any other suitable passive filter circuit may be used at each filter path without departing from the scope of the invention.

According to the illustrated embodiment, passive bandpass loop filter 18 comprises switches $S_{jk}$, where j=1, . . . , n and represents a switch of a filter path k, and where k=1, . . . , N and represents the filter path at which the switch is located. For example, switch $S_{11}$ represents the first switch of the first filter path. Switches $S_{jk}$ are activated according to pulses of a corresponding control signal 24. For example, switch $S_{11}$ may be activated according to a pulse of a corresponding control signal $\phi_{11}$. Examples of control signals are described with reference to FIG. 2. Passive bandpass loop filter 18 may include any number of switches $S_{jk}$ without departing from the scope of the invention.

Passive bandpass loop filter 18 includes a passive switched capacitor (SC) highpass filter 14 at each filter path 13. Although in this embodiment a highpass filter has been described, it will be understood that any other suitable filter response such as a low pass filter may be used. According to the illustrated embodiment, passive SC highpass filter 14 operates according to a transfer function H as described by Equation (1):

$$H = \frac{\alpha}{1 + (1-\alpha)z^{-k}} \quad (1)$$

where $\alpha$ is the RC coefficient corresponding to the passive filter components, k represents the filter path, and z−1 represents one clock cycle delay. Placing passive SC highpass filters 14 in parallel may result in a transfer function Y as described by Equation (2):

$$Y = \frac{\alpha}{1 + (1-\alpha)z^{-N}} \quad (2)$$

where transfer function Y has a passband centered at approximately $F_s(i/2N)$ with $F_s$ representing the sampling frequency at which bandpass sigma-delta modulator 10 operates.

Quantizer 16 quantizes the filtered signal from each passive bandpass loop filter 18. According to the illustrated embodiment, quantizer 16 comprises a one bit high speed comparator that quantizes the filtered signals to generate a digital signal 22. Quantizer 16 may be activated according to a main control signal $\overline{\phi}_{2m}$ in order for quantizer 16 to generate a bit at substantially every low pulse of main control signal $\overline{\phi}_{2m}$. Quantizer 16 may also direct digital signal 22 to sample-hold circuit 12 to form a feedback loop that feeds digital signal 22 to be summed with the sampled analog signal at sample-hold circuit 12. The feedback loop may include additional filters, circuits, components, converters, and processors without departing from the scope of the invention.

Modifications, additions, or omissions may be made to bandpass SDM 10 without departing from the scope of the invention. For example, passive SC highpass filter 14 may be configured using any other suitable filter such as a lowpass filter without departing from the scope of the invention. As another example, passive bandpass loop filter 18 may include any suitable number of passive SC highpass filters 14. Additionally, functions may be performed using any suitable logic comprising software, hardware, other logic, or any suitable combination of the preceding. "Each" as used in this document refers to each member of a set or each member of a subset of a set.

FIG. 2 is an example of a timing diagram illustrating control signals that may be used with the bandpass SDM 10 of FIG. 1. FIG. 3 is a circuit diagram of an embodiment of the bandpass sigma-delta modulator 10 of FIG. 1. FIG. 4 is an example of a timing diagram illustrating control signals that may be used with bandpass SDM 10 of FIG. 3.

FIG. 2 is an example of a timing diagram 24 illustrating control signals that may be used with the bandpass SDM 10 of FIG. 1. For example, timing diagram 24 includes control signals $\phi_{2m}$, $\phi_{11}$, $\phi_{1N}$, $\phi_{21}$, and $\phi_{2N}$. Any other number of signals may be used without departing from the scope of the invention. For example, for bandpass SDM 10 having more than two filter paths 13, timing diagram 24 may include additional control signals.

FIG. 3 is a circuit diagram of an embodiment of the bandpass sigma-delta modulator 10 of FIG. 1. According to the illustrated embodiment, bandpass SDM 10 is configured as a two-path fourth-order passive bandpass sigma-delta modulator. Passive bandpass loop filter 18 comprises a first passive SC highpass filter 14*a* and a second passive SC highpass filter 14*b*. As illustrated, first and second passive. SC highpass filter 14*a* and 14*b* comprise fourth-order passive filters. Passive bandpass loop filter 18 may comprise any suitable number of passive SC highpass filters 14. Passive SC highpass filters 14 may comprise a higher or lower order of passive filter without departing from the scope of the invention.

Sample-hold circuit 12 comprises sampling capacitors $C_{R1}$ that are shared between the passive SC highpass filters 14*a–b*. According to one embodiment, sampling capacitors $C_{R1}$ are switched at a sampling frequency $F_s$. At a sampling frequency $F_s$ and with two filter paths of bandpass SDM 10, input analog signal 20 may comprise any Intermediate Frequency (IF) signal having a maximum frequency of $F_s(i/4)$.

According to the illustrated embodiment, pulses of second control signal $\phi_2$ having a sampling frequency $F_s$ activate switches at sample-hold circuit 12 that sample and hold the input voltage IF signals $V_{IFP}$ and $V_{IFM}$. According to the illustrated embodiment, during a pulse of first control signal $\phi_1$, sampling capacitors $C_{R1}$ are charged to reference voltages $V_{refp}$ and $V_{refm}$, and during a pulse of second control signal $\phi_2$, input analog signal 20 is sampled and mixed with the appropriate reference voltage $V_{refp}$ or $V_{refm}$ to yield an analog sampled signal.

According to the illustrated embodiment, each passive SC highpass filter 14*a–b* comprises a switched capacitor loop 32*a–b* and a fourth-order filtering loop 34*a–b*. For example, passive SC highpass filter 14*a* comprises switched capacitor loop 32*a* and fourth-order filtering loop 32*b*. Each switched capacitor loop 32*a–b* is controlled by first control signal $\phi_1$, while each fourth-order filtering loop 34*a–b* is controlled by second control signal $\phi_2$.

Passive SC highpass filters 14*a–b* filter the analog sampled signal using switched capacitor loops 32*a–b*, fourth-order filtering loops 34*a–b*, and clock signals I and Q. According to the illustrated embodiment, switched capacitor loop 32*a–b* and fourth-order filtering loop 34*a–b* filter the analog sampled signal according to a highpass response. Clock signals I and Q may be interleaved with the highpass response signal to yield a bandpass response. Clock signals I and Q may comprise odd-indexed clock signals $\phi_{IO}$ and $\phi_{QO}$ and even-indexed clock signals $\phi_{IE}$ and $\phi_{QE}$. Examples of clock signals are described in more detail with reference to FIG. 4. Passive SC highpass filters 14 may include additional clock signals and additional control signals without departing from the scope of the invention. Additionally, switched capacitor loop 32*a–b* and fourth-order filtering loop 34*a–b* may filter the analog sampled signal according to any other suitable response, for example, a low pass response.

Quantizer 16 may comprise a one-bit quantizer that converts the bandpass response signal into a digital signal 22. According to the illustrated embodiment, quantizer 16 may be activated during the low pulses of second control signal $\phi_2$. A feedback digital-to-analog (DAC) converter may be realized at node 28 at which the bandpass response signal is fed to sample-hold circuit 12 via switched capacitors $C_{R1}$.

FIG. 4 is an example of a timing diagram 26 illustrating control signals that may be used with bandpass SDM 10 of FIG. 3. Timing diagram 26 illustrates clock signals I and Q and the timing of the pulses of the first and second control signals $\phi_1$ and $\phi_2$. According to the illustrated example, control signals $\phi_1$ and $\phi_2$ are interleaved with clock signals $\phi_{IO}$, $\phi_{IE}$, $\phi_{QO}$, and $\phi_{QE}$.

Modifications, additions, or omissions may be made to bandpass SDM 10 without departing from the scope of the invention. For example, the circuit that receives analog input 20 may be modified to include a mixing stage 30 as shown. Mixing stage 30 may comprise a Radio Frequency (RF) mixer or a transconductance circuit in order to supply a current-mode IF signal to the modulator instead of a voltage mode input signal. As another example, any suitable clock rate such as 104 MHz with an IF signal frequency of 26 MHz may be used to interleave signals at bandpass sigma-delta modulator 10. Additionally, functions may be performed using any suitable logic comprising software, hardware, other logic, or any suitable combination of the preceding.

Certain embodiments of the invention may provide one or more technical advantages. A technical advantage of one embodiment may be that a bandpass sigma-delta modulator does not require the use of active components in the loop filter, which may allow the modulator to run at low power and low voltage. Another technical advantage of one embodiment may be that the bandpass sigma-delta modulator may be operate at a high sampling rate, which may allow the bandpass sigma-delta modulator to yield a higher resolution while maintaining low power consumption.

Although an embodiment of the invention and its advantages are described in detail, a person skilled in the art could make various alterations, additions, and omissions without departing from the spirit and scope of the present invention as defined by the appended claims.

What is claimed is:

1. A method for digitizing a signal, comprising:

sampling and holding an analog signal to yield a sampled signal, the analog signal comprising information;

filtering the sampled signal at a passive filter circuit to yield a filtered signal, the passive filter circuit comprising at least one passive element, the filtered signal characterized by a bandpass response; and quantizing the filtered signal to yield a digital signal, the digital signal corresponding to the analog signal, the digital signal comprising the information.

2. The method of claim 1 wherein the analog signal comprises an intermediate frequency signal.

3. The method of claim 1 wherein the passive filter circuit comprises a passive bandpass loop filter.

4. The method of claim 1 wherein the passive filter circuit comprises at least one filter path, each filter path comprising a highpass filter.

5. The method of claim 1 wherein:

the passive filter circuit further comprises a switched capacitor circuit; and filtering the sampled signal at the passive filter circuit to yield the filtered signal further comprises:

receiving at least one timing signal and at least one control signal;

switching the switched capacitor circuit using the at least one timing signal to yield a highpass filtered signal, the highpass filtered signal characterized by a highpass response; and interleaving the highpass filtered signal with the at least one control signal to yield the filtered signal, the filtered signal characterized by the bandpass response.

6. The method of claim 1 further comprising mixing at least two voltage inputs to yield the analog signal in a current mode.

7. A sigma-delta modulator, comprising:

a sample-hold circuit operable to sample and hold an analog signal to yield a sampled signal, the analog signal comprising information;

a passive filter circuit coupled to the sample-hold circuit and operable to filter the sampled signal to yield a filtered signal, the passive filter circuit comprising at least one passive element, the filtered signal characterized by a bandpass response; and a comparator coupled to the passive filter circuit and operable to quantize the filtered signal to yield a digital signal, the digital signal corresponding to the analog signal, the digital signal comprising the information.

8. The modulator of claim 7 wherein the analog signal comprises an intermediate frequency signal.

9. The modulator of claim 7 wherein the passive filter circuit comprises a passive bandpass loop filter.

10. The modulator of claim 7 wherein the passive filter circuit comprises at least one filter path, each filter path comprising a highpass filter.

11. The modulator of claim 7 wherein the passive filter circuit comprises a switched capacitor circuit, the passive filter circuit further operable to:

receive at least one timing signal and at least one control signal;

switch the switched capacitor circuit using the at least one timing signal to yield a highpass filtered signal, the highpass filtered signal characterized by a highpass response; and interleave the highpass filtered signal with the at least one control signal to yield the filtered signal, the filtered signal characterized by the bandpass response.

12. The modulator of claim 7 further comprising a mixer stage coupled to the passive filter circuit and operable to mix at least two voltage inputs to yield the analog signal in current mode.

13. A sigma-delta modulator, comprising:

a sample-hold circuit operable to sample and hold a next analog signal to yield a sampled signal, the analog signal comprising information;

a filter circuit coupled to the sample-hold circuit and operable to filter the sampled signal to yield a filtered signal, the passive filter circuit comprising at least one passive element, the filtered signal characterized by a bandpass response;

a comparator coupled to the passive filter circuit and operable to quantize the filtered signal to yield a digital signal, the digital signal corresponding to the analog signal, the digital signal comprising the information; and a feedback loop coupled to the comparator and to the sample-hold circuit and operable to transmit a feedback signal from the comparator to the sample-hold circuit.

14. The modulator of claim 13 wherein the analog signal comprises an intermediate frequency signal.

15. The modulator of claim 13 wherein the filter circuit comprises a passive bandpass loop filter.

16. The modulator of claim 13 wherein the filter circuit comprises at least one filter path, each filter path comprising a highpass filter.

17. The modulator of claim 13 the filter circuit further comprising a switched capacitor circuit, the filter circuit further operable to:

receive at least one timing signal and at least one control signal;

switch the switched capacitor circuit using the at least one timing signal to yield a highpass filtered signal, the highpass filtered signal characterized by a highpass response; and interleave the highpass filtered signal with the at least one control signal to yield the filtered signal, the filtered signal characterized by a bandpass response.

18. The modulator of claim 13 further comprising a mixer stage coupled to the filter circuit and operable to mix at least two voltage inputs to yield the next analog signal in current mode.

19. A sigma-delta modulator, comprising:

means for sampling and holding an analog signal to yield a sampled signal, the analog signal comprising information;

means for filtering the sampled signal with a passive filter circuit to yield a filtered signal, the passive filter circuit comprising at least one passive element, the filtered signal characterized by a bandpass response; and means for quantizing the filtered signal to yield a digital signal, the digital signal corresponding to the analog signal, the digital signal comprising the information.

20. A sigma-delta modulator, comprising:

a sample-hold circuit operable to sample and hold a next analog signal to yield a sampled signal, the analog signal comprising information, the analog signal comprising an intermediate frequency signal;

a filter circuit coupled to the sample-hold circuit and operable to filter the sampled signal to yield a filtered signal, the passive filter circuit comprising at least one passive element, the filtered signal characterized by a bandpass response, the filter circuit comprising a at least one filter path, each filter path comprising a highpass filter, the filter circuit further comprising at least two paths, each path comprising a switched capacitor circuit, the filter circuit further operable to:

receive at least one timing signal and at least one control signal;

switch the switched capacitor circuit using the at least one timing signal to yield a highpass filtered signal, the highpass filtered signal characterized by a highpass response; and interleave the highpass filtered signal with the at least one control signal to yield the filtered signal, the filtered signal characterized by a bandpass response;

a comparator coupled to the passive filter circuit and operable to quantize the filtered signal to yield a digital signal, the digital signal corresponding to the analog signal, the digital signal comprising the information;

a feedback loop coupled to the comparator and to the sample-hold circuit and operable to transmit a feedback signal from the comparator to the sample-hold circuit; and a mixer stage coupled to the filter circuit and operable to mix at least two voltage inputs to yield the next analog signal in current mode.

* * * * *